United States Patent
Nodera et al.

(10) Patent No.: US 10,243,003 B2
(45) Date of Patent: Mar. 26, 2019

(54) THIN FILM TRANSISTOR AND DISPLAY PANEL

(71) Applicant: Sakai Display Products Corporation, Sakai-shi, Osaka (JP)

(72) Inventors: Nobutake Nodera, Sakai (JP); Shigeru Ishida, Sakai (JP); Ryohei Takakura, Sakai (JP); Yoshiaki Matsushima, Sakai (JP); Takao Matsumoto, Sakai (JP); Kazuki Kobayashi, Sakai (JP); Taimi Oketani, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 41 days.

(21) Appl. No.: 15/327,588

(22) PCT Filed: Mar. 27, 2015

(86) PCT No.: PCT/JP2015/059702
§ 371 (c)(1),
(2) Date: Jan. 19, 2017

(87) PCT Pub. No.: WO2016/157313
PCT Pub. Date: Oct. 6, 2016

(65) Prior Publication Data
US 2017/0154901 A1  Jun. 1, 2017

(51) Int. Cl.
*H01L 27/12* (2006.01)
*H01L 29/786* (2006.01)
*H01L 29/66* (2006.01)

(52) U.S. Cl.
CPC .... *H01L 27/1222* (2013.01); *H01L 29/66765* (2013.01); *H01L 29/7866* (2013.01); *H01L 29/78669* (2013.01); *H01L 29/78696* (2013.01)

(58) Field of Classification Search
CPC .................................................. H01L 27/1222
See application file for complete search history.

(56) References Cited

U.S. PATENT DOCUMENTS

| 4,404,578 | A | * | 9/1983 | Takafuji | ................ | G02F 1/1368 |
| | | | | | | 257/401 |
| 6,093,586 | A | * | 7/2000 | Gosain | ................ | H01L 21/2026 |
| | | | | | | 148/DIG. 100 |

(Continued)

FOREIGN PATENT DOCUMENTS

| JP | 2009-289874 A | 12/2009 |
| JP | 5226259 B2 | 7/2013 |
| WO | WO2011010611 A1 | 1/2011 |

*Primary Examiner* — Eugene Lee
(74) *Attorney, Agent, or Firm* — Rudy J. Ng; Bret E. Field; Bozicevic, Field & Francis LLP

(57) ABSTRACT

The thin film transistor includes: a gate electrode formed on a surface of a substrate; a polysilicon layer formed on an upper side of the gate electrode; an amorphous silicon layer formed on the polysilicon layer so as to cover the same; an n+ silicon layer formed on an upper side of the amorphous silicon layer; and a source electrode and a drain electrode which are formed on the n+ silicon layer, wherein, in a projected state in which the polysilicon layer, the source electrode and the drain electrode are projected onto the surface of the substrate, a part of the polysilicon layer and a part of each of the source electrode and the drain electrode are adapted so as to be overlapped with each other, and in the projected state, a minimum dimension, in a width direction orthogonal to a length direction between the source electrode and the drain electrode, of the polysilicon layer located between the source electrode and the drain electrode is smaller than dimensions in the width direction of the source electrode and the drain electrode.

6 Claims, 18 Drawing Sheets

(56) References Cited

U.S. PATENT DOCUMENTS

| | | | | |
|---|---|---|---|---|
| 8,049,255 B2* | 11/2011 | Sakai | ............... | H01L 27/1214 |
| | | | | 257/223 |
| 2005/0014379 A1* | 1/2005 | Choi | ............... | H01L 27/3244 |
| | | | | 438/700 |
| 2005/0218403 A1* | 10/2005 | Kuo | ............... | H01L 29/66765 |
| | | | | 257/59 |
| 2006/0290633 A1* | 12/2006 | Choi | ............... | H01L 27/12 |
| | | | | 345/92 |
| 2009/0050896 A1 | 2/2009 | Kaitoh et al. | | |
| 2009/0095957 A1* | 4/2009 | Miyake | ............... | H01L 27/1229 |
| | | | | 257/59 |
| 2011/0147755 A1* | 6/2011 | Miyairi | ............ | H01L 29/66765 |
| | | | | 257/60 |
| 2014/0014951 A1* | 1/2014 | Kawashima | ...... | H01L 29/41733 |
| | | | | 257/43 |
| 2015/0236044 A1* | 8/2015 | Kim | ............... | H01L 27/124 |
| | | | | 257/72 |

* cited by examiner

F I G. 10
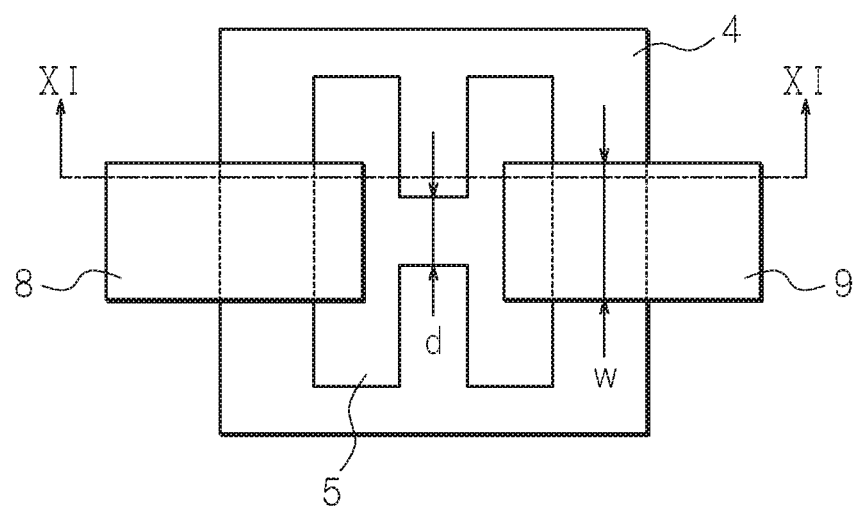

THIN FILM TRANSISTOR AND DISPLAY PANEL

CROSS-REFERENCE TO RELATED APPLICATIONS

This application is the national phase under 35 U.S.C. § 371 of PCT International Application No. PCT/JP2015/059702 which has an International filing date of Mar. 27, 2015 and designated the United States of America.

FIELD

The present invention relates to a thin film transistor and a display panel including the thin film transistor.

BACKGROUND

A thin film transistor (TFT) type liquid crystal display includes a TFT substrate and a color filter substrate having red (R), green (G) and blue (B) colors, in which the TFT substrate and the color filter substrate are bonded to each other at a required gap, and liquid crystal is injected and sealed therebetween, and may display an image by controlling transmittance of light by liquid crystal molecules for each pixel.

In the TFT substrate, data lines and scanning lines are wired in a lattice shape in longitudinal and lateral directions, and pixels including the TFTs are formed in places where the data lines and the scanning lines intersect with each other. In addition, a driving circuit for driving the data lines and the scanning lines, which include the TFTs, is formed around a display region including a plurality of pixels.

There are two types of TFTs, an amorphous silicon (a-Si) TFT in an amorphous state and a polycrystalline silicon (p-Si) in a polycrystalline state depending on the crystalline state of a semiconductor (silicon). The a-Si TFT has a high resistance and a low leakage current (leak current). In addition, the p-Si TFT has dramatically higher mobility of electrons than that of the a-Si TFT. For this reason, the a-Si TFT having the low leakage current is used for each pixel included in the display region, and the p-Si TFT having the higher mobility of electrons is used for the driving circuit.

Meanwhile, from a structure viewpoint of the TFT, generally, the a-Si TFT uses a bottom gate structure in which a gate electrode is disposed in the lowermost layer, and the p-Si TFT uses a top gate structure in which the gate electrode is disposed on an upper side of a semiconductor film. However, if TFTs having different structures from each other are formed on one substrate, a manufacturing process becomes complicated.

In this regard, a liquid crystal display device having a structure in which, in the TFT of the bottom gate structure, an a-Si layer is formed by covering a p-Si layer to prevent the p-Si layer and the source and drain electrodes from directly contacting with each other, is disclosed (see Japanese Patent Publication No. 5226259).

SUMMARY

However, in the liquid crystal display device of Japanese Patent Publication No. 5226259, the a-Si layer is formed on an entire substrate in advance, and the a-Si layer is changed to the p-Si layer in a polycrystalline state by irradiating the entire substrate with a laser.

In addition, after the crystallization, the p-Si layer is formed on an entire region of the channel between the source electrode and the drain electrode via exposure, development and etching processes. However, the p-Si layer has a high mobility of electrons, while has a problem that an off-current (also referred to as a leakage current) is increased. In the TFT having a top gate structure, as a method of reducing the off-current, a structure such as light doped drain (LDD) may be employed, but there are problems that the number of the manufacturing processes is increased and costs thereof are increased.

In consideration of the above-mentioned circumstances, it is an object of the present disclosure to provide a thin film transistor capable of reducing an off-current, and a display panel including the thin film transistor.

A thin film transistor according to the present disclosure includes a gate electrode formed on a surface of a substrate, a polysilicon layer formed on an upper side of the gate electrode, an amorphous silicon layer formed so as to cover the polysilicon layer, an n+ silicon layer formed on an upper side of the amorphous silicon layer, and a source electrode and a drain electrode which are formed on the n+ silicon layer, wherein, in a projected state in which the polysilicon layer, the source electrode and the drain electrode are projected onto the surface of the substrate, a part of the polysilicon layer and a part of each of the source electrode and the drain electrode are adapted so as to be overlapped with each other, and in the projected state, a minimum dimension, in a width direction orthogonal to a length direction between the source electrode and the drain electrode, of the polysilicon layer located between the source electrode and the drain electrode is smaller than dimensions in the width direction of the source electrode and the drain electrode.

According to the present disclosure, the thin film transistor includes the gate electrode formed on the surface of the substrate, the polysilicon layer (also referred to as a p-Si film) formed on the upper side of the gate electrode, the amorphous silicon layer (also referred to as an a-Si film) formed so as to cover the polysilicon layer, the n+ silicon layer formed on the upper side of the amorphous silicon layer, and the source electrode and the drain electrode which are formed on the n+ silicon layer. In addition, in the projected state in which the polysilicon layer, the source electrode and the drain electrode are projected onto the surface of the substrate, a part of the polysilicon layer and a part of each of the source electrode and the drain electrode are adapted so as to be overlapped with each other. The amorphous silicon layer has a high resistance and a low off-current (leakage current). In addition, the polysilicon layer has dramatically higher mobility of electrons than that of the amorphous silicon layer.

That is, the channel region between the source electrode and the drain electrode includes the polysilicon layer, and the amorphous silicon layer formed so as to cover the polysilicon layer. In the above-described projected state, the minimum dimension, in the width direction orthogonal to the length direction between the source electrode and the drain electrode, of the polysilicon layer located between the source electrode and the drain electrode is smaller than the dimensions in the width direction of the source electrode and the drain electrode. The width direction is a direction orthogonal to the length direction of the channel region between the source electrode and the drain electrode. By setting the minimum dimension in the width direction of the polysilicon layer in the channel region to be smaller than the dimensions in the width direction of the source electrode and the drain electrode, as the channel region, a region of the amorphous silicon layer having a high resistance is increased, such that the off-current may be more reduced than the case in which the dimension in the width direction of the polysilicon layer is set to be approximately equal to the dimension in the width direction of the source electrode or the drain electrode. In addition, in the above-described projected state, a part of the polysilicon layer and a part of each of the source electrode and the drain electrode are adapted so as to be overlapped with each other, such that a decrease in the mobility of electrons or an on-current may be suppressed.

A thin film transistor according to the present disclosure, wherein, in the projected state, the polysilicon layer and at least one of the source electrode and the drain electrode are adapted so as to be overlapped with each other through one or a plurality of boundary lines in the width direction, and an entire length of the boundary line between the polysilicon layer and the source electrode or an entire length of the boundary line between the polysilicon layer and the drain electrode is smaller than the dimension in the width direction of the source electrode or the drain electrode.

According to the present disclosure, in the above-described projected state, the polysilicon layer and at least one of the source electrode and the drain electrode are adapted so as to be overlapped with each other through one or the plurality of boundary lines in the width direction. When the polysilicon layer and the source electrode are overlapped with each other through the boundary line, the entire length of the boundary line between the polysilicon layer and the source electrode is smaller than the dimension in the width direction of the source electrode. In addition, when the polysilicon layer and the drain electrode are overlapped with each other through the boundary line, the entire length of the boundary line between the polysilicon layer and the drain electrode is smaller than the dimension in the width direction of the drain electrode. Further, the entire length of the boundary line is the dimension in the width direction of the boundary line when there is one boundary line, and is a sum of the dimensions in the width direction of each boundary line when there are a plurality of boundary lines.

By setting the entire length of the boundary line to be smaller than the dimension in the width direction of the source electrode or the drain electrode, in the channel region, a region adjacent to or a region in the vicinity of the source electrode or the drain electrode is formed into the amorphous silicon layer, such that it is possible to reduce the off-current while suppressing a decrease in the on-current.

A thin film transistor according to the present disclosure, wherein a ratio of the entire length of the boundary line between the polysilicon layer and the source electrode to the dimension in the width direction of the source electrode, or a ratio of the entire length of the boundary line between the polysilicon layer and the drain electrode to the dimension in the width direction of the drain electrode is larger than 0.1 and smaller than 0.7.

According to the present disclosure, the ratio of the entire length of the boundary line between the polysilicon layer and the source electrode to the dimension in the width direction of the source electrode, or the ratio of the entire length of the boundary line between the polysilicon layer and the drain electrode to the dimension in the width direction of the drain electrode is larger than 0.1 and smaller than 0.7. If the ratio is set to be 0.1 or less, the region of the polysilicon layer in the channel region is decreased and the region of the amorphous silicon layer is increased, such that the mobility of electrons in the channel region is decreased. In addition, if the ratio is set to be 0.7 or more, the region of the polysilicon layer in the channel region is increased and the region of the amorphous silicon layer is decreased, such that the off-current is increased. By setting the ratio to be larger than 0.1 and smaller than 0.7, the off-current may be reduced while suppressing a decrease in the mobility of electrons of the channel region (that is, without decreasing the on-current).

A thin film transistor according to the present disclosure, wherein the amorphous silicon layer includes a first amorphous silicon layer which is formed around the polysilicon layer and has a thickness approximately equal to the thickness of the polysilicon layer, and a second amorphous silicon layer formed on the surfaces of the polysilicon layer and the first amorphous silicon layer.

According to the present disclosure, the amorphous silicon layer includes the first amorphous silicon layer which is formed around the polysilicon layer and has a thickness approximately equal to the thickness of the polysilicon layer, and the second amorphous silicon layer formed on the surfaces of the polysilicon layer and the first amorphous silicon layer. That is, the polysilicon layer is obtained in such a way that, in the first amorphous silicon layer formed on the upper side of the gate electrode, only a region corresponding to the channel region is changed to the polysilicon layer which is the polycrystalline state. Therefore, it can be seen that each processing of exposure, development and etching process for forming the channel region is not performed. Further, since the second amorphous silicon layer is provided so as to prevent the source and drain electrodes and the channel region from directly contacting with each other, the feature of having a low off-current (leakage current) is used. Thereby, it is possible to reduce the off current.

A display panel according to the present disclosure includes the thin film transistor according to the present invention.

According to the present disclosure, it is possible to provide a display panel capable of reducing the off-current.

According to the present disclosure, it is possible to reduce the off-current.

The above and further objects and features of the invention will more fully be apparent from the following detailed description with accompanying drawings.

BRIEF DESCRIPTION OF THE DRAWINGS

FIG. 10 is a schematic plan view of main components illustrating a fifth example of the structure of the thin film transistor according to the present embodiment.

DETAILED DESCRIPTION

Figure 1:
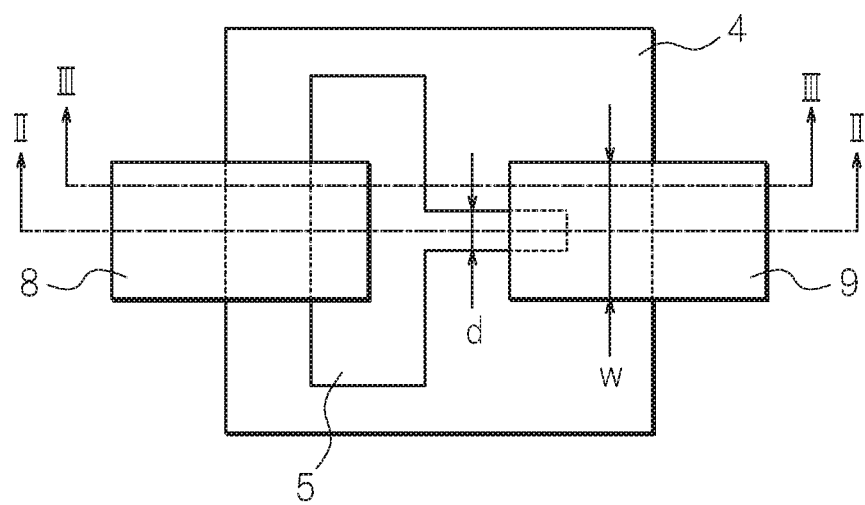
FIG. 1 is a schematic plan view of main components illustrating a first example of a structure of a thin film transistor according to the present embodiment.
Figure 2:
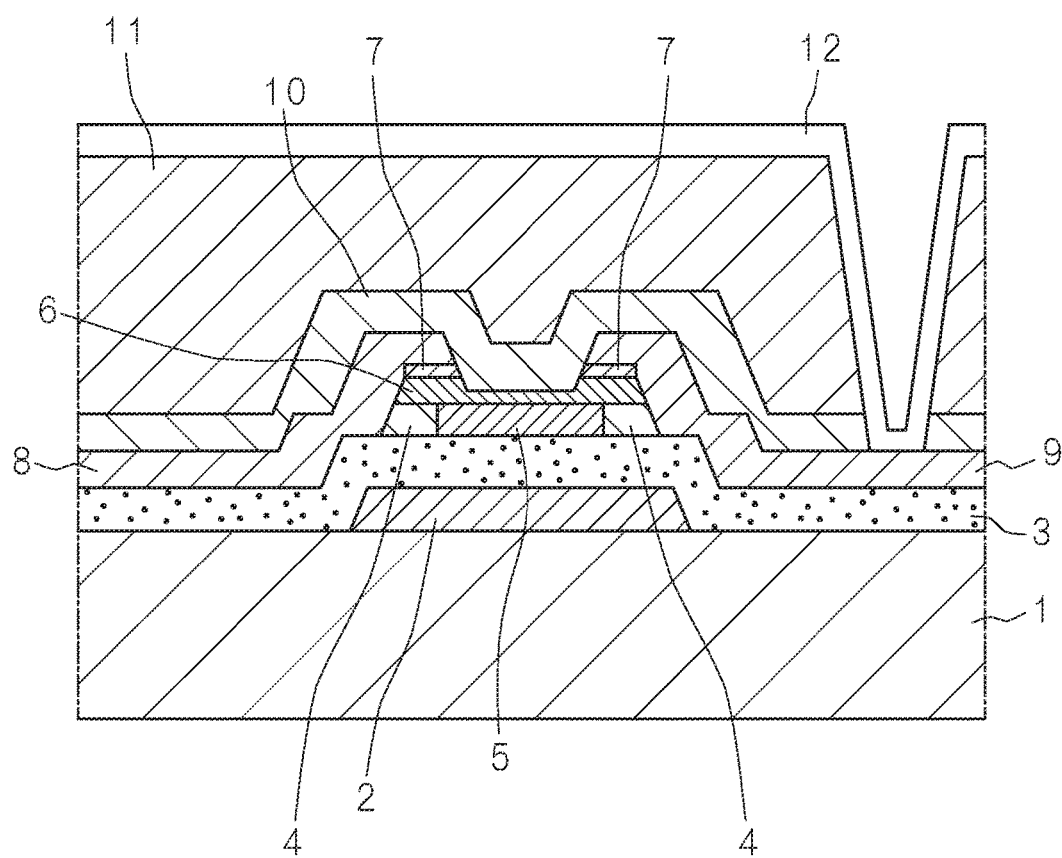
FIG. 2 is a schematic cross-sectional view of the main components as seen from line II-II of FIG. 1.
Figure 3:
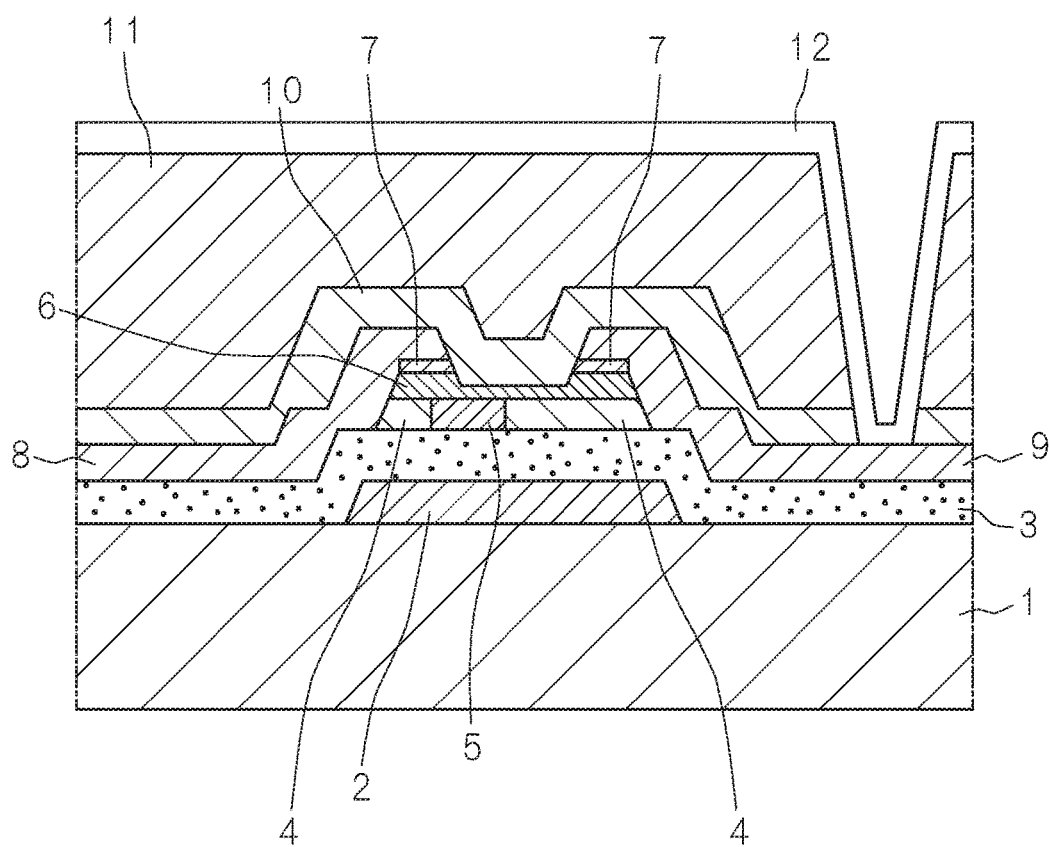
FIG. 3 is a schematic cross-sectional view of the main components as seen from line III-III of FIG. 1.

Hereinafter, embodiments of the present invention will be described with reference to the accompanying drawings illustrating the embodiments thereof. FIG. 1 is a schematic plan view of main components illustrating a first example of a structure of a thin film transistor according to the present embodiment, FIG. 2 is a schematic cross-sectional view of the main components as seen from line II-II of FIG. 1, and FIG. 3 is a schematic cross-sectional view of the main components as seen from line III-III of FIG. 1. As illustrated in FIGS. 2 and 3, the thin film transistor (also referred to as a TFT substrate) includes a gate electrode 2 formed on a surface of a glass substrate 1 (also referred to as a substrate), and a gate insulation film 3 (for example, an $SiO_2$ film, $SiO_2$/SiN film laminate, SiN film, or the like) formed by covering the gate electrode 2.

In addition, as illustrated in FIGS. 1 to 3, a polysilicon layer 5 (also referred to as a p-Si film. Further, the polysilicon layer includes not only polycrystals, but also microcrystals having a relatively smaller crystal grain size or single crystals having higher crystallinity than the polycrystals) is formed on a surface of the gate insulation film 3 and an upper side of the gate electrode 2. A first amorphous silicon layer 4 (also referred to as an a-Si film) and a second amorphous silicon layer 6 (also referred to as an a-Si film) are formed on the polysilicon layer 5 so as to cover the same. The first amorphous silicon layer 4 and the second amorphous silicon layer 6 are collectively referred to as an amorphous silicon layer.

An n+ silicon layer 7 (n+Si film) is formed at a required position on the surface of the second amorphous silicon layer 6. The n+ silicon layer 7 is a contact layer with a source electrode 8 and a drain electrode 9, and is a semiconductor layer having a high impurity concentration such as phosphorus or arsenic.

The source electrode 8 and the drain electrode 9 respectively having a required pattern are formed on the surface of the n+ silicon layer 7, side faces of the second amorphous silicon layer 6 and the first amorphous silicon layer 4, and the surface of the gate insulation film 3.

The first amorphous silicon layer 4 and the second amorphous silicon layer 6 have a high resistance and a low off current (leakage current), respectively. In addition, the polysilicon layer 5 has dramatically higher mobility of electrons than that of the amorphous silicon layer. Further, the channel region between the source electrode 8 and the drain electrode 9 includes the polysilicon layer 5, and the first amorphous silicon layer 4 and the second amorphous silicon layer 6 which are formed on the polysilicon layer 5 so as to cover the same.

A passivation film 10 made of, for example, SiN is formed on an entire TFT substrate so as to cover the source electrode 8 and the drain electrode 9, and an organic film 11 is formed on a surface of the passivation film 10 to flatten the surface thereof. Through holes are formed in required positions of the passivation film 10 and the organic film 11 so that a pixel electrode 12 and the drain electrode 9 (and the source electrode 8) conduct with each other through the through holes. The pixel electrode 12 is made of a transparent conductive film (for example, ITO).

FIG. 1 schematically illustrates a projected state in which the first amorphous silicon layer 4, the polysilicon layer 5, the source electrode 8 and the drain electrode 9 are projected onto the surface of the substrate 1. Further, in FIG. 1, the second amorphous silicon layer 6 and other components are not illustrated for the sake of simplicity. As illustrated in FIG. 1, a part of the polysilicon layer 5 and a part of each of the source electrode 8 and the drain electrode 9 are adapted so as to be overlapped with each other. Further, in FIG. 1, a length direction between the source electrode 8 and the drain electrode 9, that is, a direction orthogonal to the length direction of the channel region is referred to as a width direction. In the example of FIG. 1, dimensions in the width direction of the source electrode 8 and the drain electrode 9 are denoted by W.

As illustrated in FIG. 1, in the above-described projected state, a minimum dimension in the width direction of the polysilicon layer 5 located between the source electrode 8 and the drain electrode 9 (dimension illustrated by symbol d in FIG. 1) is smaller than the dimension W in the width direction of the drain electrode 9.

By setting the minimum dimension d in the width direction of the polysilicon layer 5 in the channel region to be smaller than the dimension W in the width direction of the source electrode 8 or the drain electrode 9, as the channel region, a region of the amorphous silicon layer 4 having a high resistance is increased, such that the off-current may be more reduced than the case in which the dimension in the width direction of the polysilicon layer is set to be approximately equal to the dimension in the width direction of the source electrode or the drain electrode. In addition, as illustrated in FIG. 1, a part of the polysilicon layer 5 and a part of each of the source electrode 8 and the drain electrode 9 are adapted so as to be overlapped with each other, such that a decrease in the mobility of electrons or an on-current may be suppressed.

In addition, as illustrated in FIG. 1, the polysilicon layer 5 and at least one of the source electrode 8 and the drain electrode 9 are adapted so as to be overlapped with each other through one or a plurality of boundary lines in the width direction. In the example of FIG. 1, an entire length of the boundary line in the width direction between the polysilicon layer 5 and the source electrode 8 is equal to the dimension W in the width direction of the source electrode 8. On the other hand, an entire length (illustrated by the symbol d in FIG. 1) of the boundary line in the width direction between the polysilicon layer 5 and the drain electrode 9 is smaller than the dimension W in the width direction of the drain electrode 9. Further, the entire length of the boundary line is the dimension in the width direction of the boundary line when there is one boundary line, and is a sum of the dimensions in the width direction of each boundary line when there are a plurality of boundary lines.

That is, when seen in the above-described projected state, a substantially half of the polysilicon layer 5 on the source electrode 8 side is formed so as to have a rectangular shape in which the dimension in the width direction thereof is larger than the dimension W in the width direction of the source electrode 8. On the other hand, another substantially half of the polysilicon layer 5 on the drain electrode 9 side is formed so as to have a rectangular shape in which the dimension d in the width direction is smaller than the dimension W in the width direction of the drain electrode 9.

By setting the entire length of the boundary line to be smaller than the dimension W in the width direction of the source electrode 8 or the drain electrode 9, in the channel region, a region adjacent to or a region in the vicinity of the source electrode 8 or the drain electrode 9 is formed into the amorphous silicon layer 4, such that it is possible to reduce the off-current while suppressing a decrease in the on-current.

In the example of FIG. 1, the substantially half of the polysilicon layer 5 on the drain electrode 9 side is formed so as to have the rectangular shape in which the dimension d in the width direction is smaller than the dimension W in the width direction of the drain electrode 9. But, it is not limited thereto, and the substantially half of the polysilicon layer 5 on the source electrode 8 side may be formed so as to have a rectangular shape in which the dimension in the width direction thereof is smaller than the dimension W in the width direction of the source electrode 8.

As illustrated in FIGS. 2 and 3, the amorphous silicon layer includes the first amorphous silicon layer 4 which is formed around the polysilicon layer 5 and has a thickness approximately equal to the thickness of the polysilicon layer 5, and the second amorphous silicon layer 6 formed on the surfaces of the polysilicon layer 5 and the first amorphous silicon layer 4.

That is, the polysilicon layer 5 is obtained in such a way that, in the first amorphous silicon layer 4 formed on the upper side of the gate electrode 2, a part of the channel region is changed to the polysilicon layer 5 which is the polycrystalline state. Therefore, it may be seen that each processing of exposure, development and etching process for forming the channel region is not performed. Further, since the second amorphous silicon layer 6 is provided so as to prevent the source and drain electrodes 8 and 9 and the channel region from directly contacting with each other, a feature of having a low off-current (leakage current) is used. Thereby, the off-current may be reduced.

Figure 4:
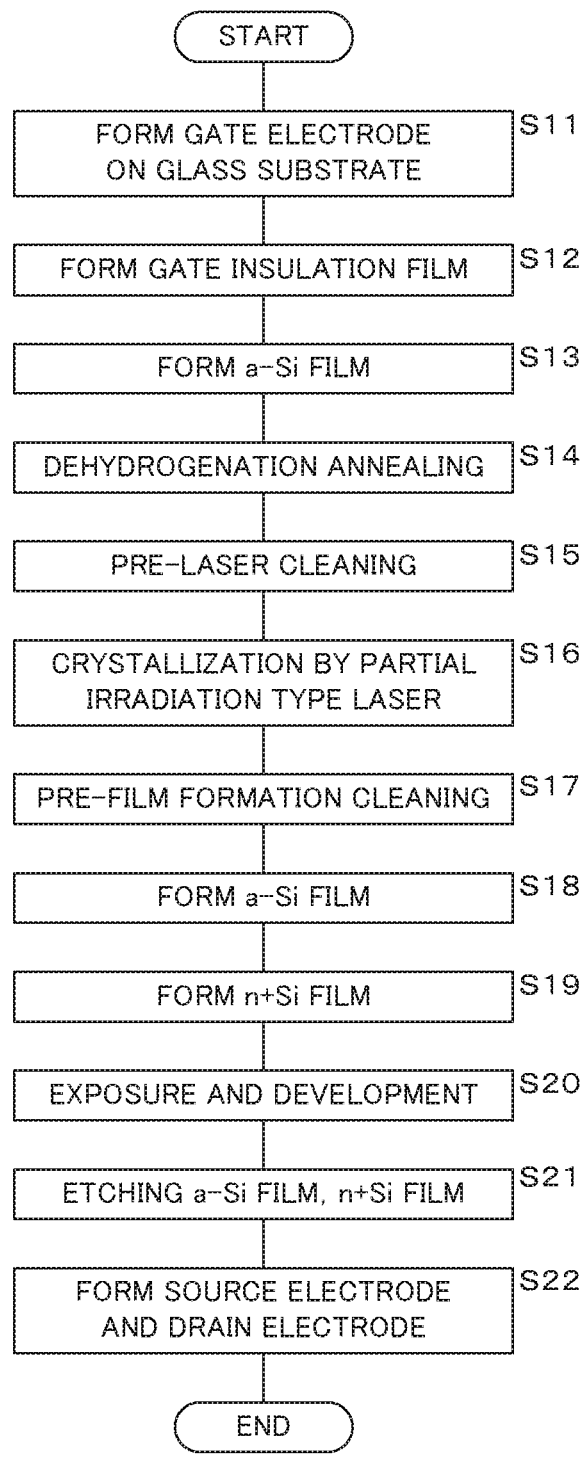
FIG. 4 is a flow chart of manufacturing processes illustrating an example of a method of manufacturing the thin film transistor according to the present embodiment.

FIG. 4 is a flow chart of manufacturing processes illustrating an example of a method of manufacturing the thin film transistor according to the present embodiment. Hereinafter, the manufacturing processes of the thin film transistor according to the present embodiment will be described. As illustrated in FIG. 4, the gate electrode 2 is formed on the glass substrate 1 (S11), and the gate insulation film 3 is formed on the surface of the glass substrate 1 by covering the gate electrode 2 (S12).

Then, the a-Si film 4 as the first amorphous silicon layer is formed on the surface of the glass substrate 1 on which the gate insulation film 3 is formed (S13). In order to laser anneal the a-Si film 4, dehydrogenation annealing treatment is performed (S14), and cleaning prior to laser annealing is performed (S15).

Next, crystallization of the a-Si film 4 by a partial irradiation type laser is performed (S16). The crystallization process is an annealing process (also referred to as a laser annealing process). For example, a required place is changed to the polysilicon layer (p-Si film) 5 by irradiating the required place of the a-Si film 4 with an energy beam through a multi-lens array. The required place is the upper side of the gate electrode 2, and is a channel region between the source and the drain. In this case, the polysilicon layer 5 may have a shape in a plan view, for example, as illustrated in FIG. 1. The energy beam may use, for example, an excimer laser of ultraviolet light, in which absorption of the amorphous silicon layer (a-Si film) is large.

Figure 5:
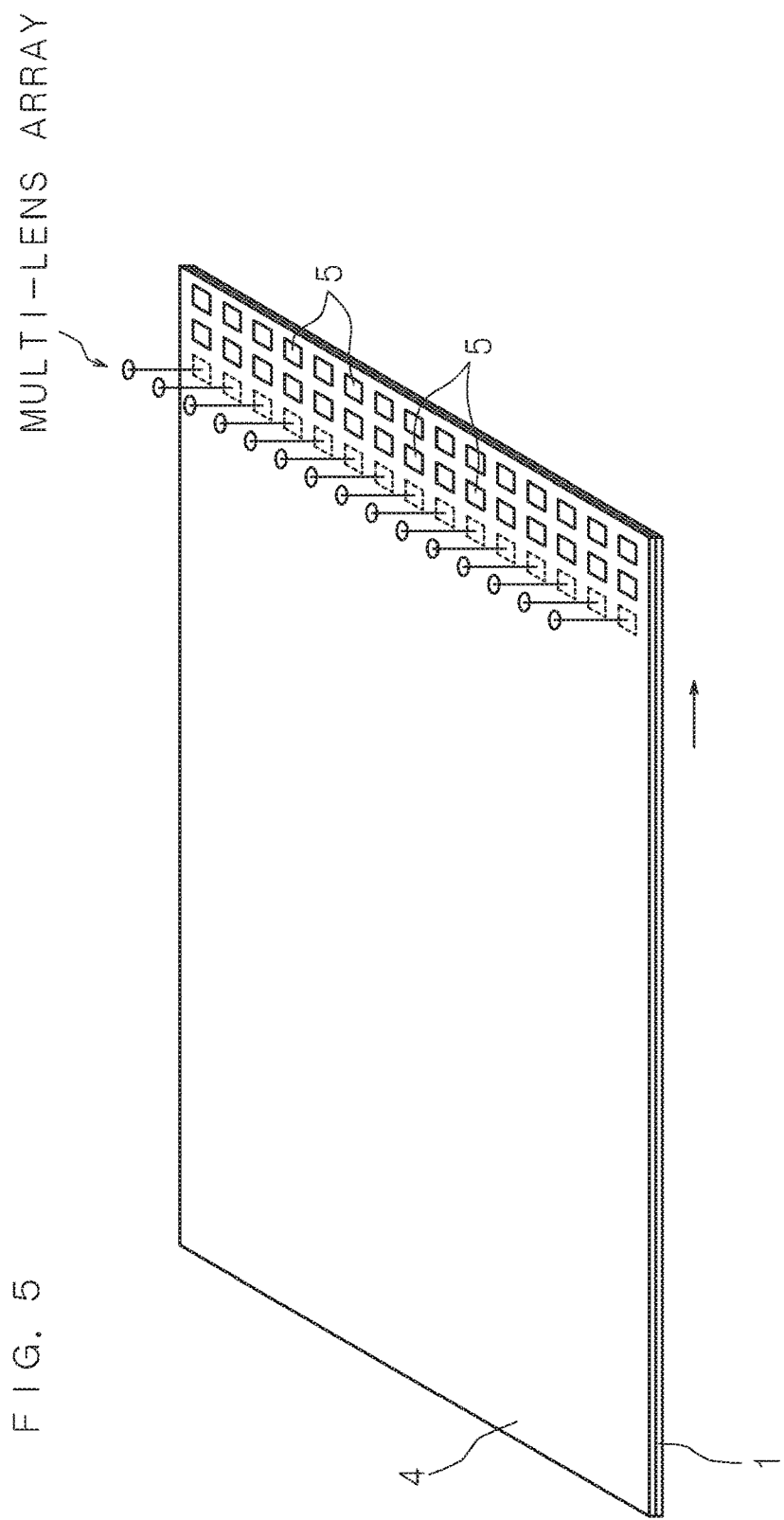
FIG. 5 is a schematic view illustrating an example of a configuration of a partial irradiation type laser.

FIG. 5 is a schematic view illustrating an example of a configuration of the partial irradiation type laser. As illustrated in FIG. 5, the glass substrate 1 on which the a-Si film 4 is formed is placed on a mount table (not illustrated), and is moved parallel to a direction shown by an arrow in FIG. 5 at a required speed. A multi-lens array, in which individual lenses are arranged at an appropriate length in a direction intersecting the moving direction of the glass substrate 1, is disposed above the glass substrate 1. A laser beam from a laser light source (not illustrated) is made incident on the multi-lens array, thereby the laser beam is partially irradiated to a plurality of required places separated from each other via different optical paths for each lens. That is, partial laser annealing may be performed. Thereby, in the a-Si film 4, only the required region of the channel region is selectively changed to the polysilicon layer (p-Si film) 5.

Then, cleaning prior to film formation is performed (S17), and by covering the polysilicon layer 5 that has been in the polycrystalline state by the annealing process and the a-Si film 4, the a-Si film 6 as the second amorphous silicon layer is formed (S18). The n+Si film (n+ silicon layer) 7 is formed on the surface of the a-Si film 6 (S19). The n+Si film 7 is a contact layer with the source electrode 8 and the drain electrode 9, and is a semiconductor layer having a high impurity concentration such as phosphorus or arsenic.

Next, exposure and development process are performed (S20), and a required pattern is formed on the n+Si film (n+ silicon layer) 7. The required pattern may be appropriately determined according to an arrangement or structure of the source electrode 8, the drain electrode 9 and the semiconductor layer. Then, in order to make the semiconductor layer have a required structure, the a-Si films 4 and 6 and the n+Si film 7 are etched (S21), and the source electrode 8 and the drain electrode 9 are formed on the n+Si film 7 after the etching (S22).

According to the manufacturing method of the present embodiment, the entire surface of the substrate is not irradiated with an energy beam (for example, laser), but, in the first amorphous silicon layer 4, while leaving the first amorphous silicon layer 4 of a required place (for example, the amorphous silicon layer 4 exemplified in FIG. 1) of the channel region as it is, only the first amorphous silicon layer 4 of the other places, that is, a region (for example, the polysilicon layer 5 exemplified in FIG. 1) to be the polysilicon layer 5 is partially irradiated with the energy beam, such that it is possible to form the channel region only by the annealing process. Therefore, it is not required for the polysilicon layer crystallized on the whole of the substrate surface to be subjected to each process of exposure, development and etching process for forming the channel region, and thereby the manufacturing process may be shortened.

Figure 6:
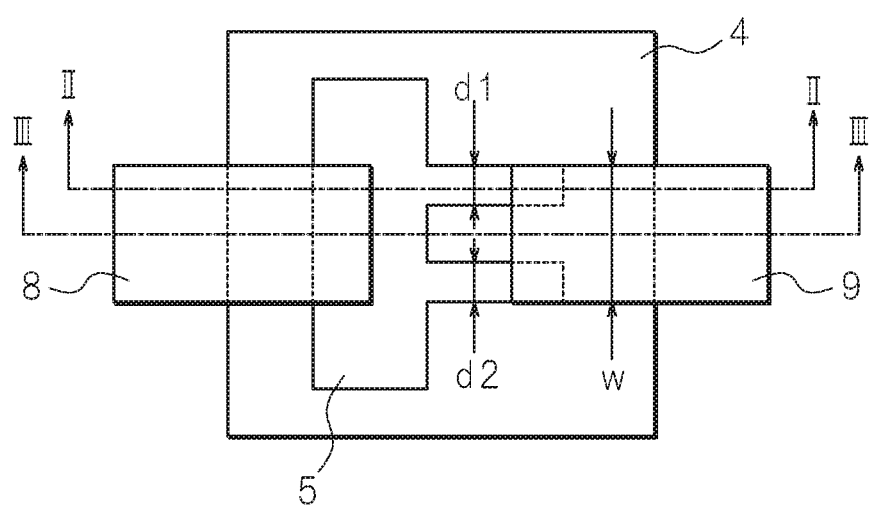
FIG. 6 is a schematic plan view of main components illustrating a second example of the structure of the thin film transistor according to the present embodiment.

FIG. 6 is a schematic plan view of main components illustrating a second example of the structure of the thin film transistor according to the present embodiment. Further, in FIG. 6, a schematic cross-sectional view of main components as seen from line II-II is similar to that of FIG. 2, and a schematic cross-sectional view of main components as seen from line III-III is the same as FIG. 3. As illustrated in FIG. 6, in the second example, a substantially half of the polysilicon layer 5 on the source electrode 8 side is formed so as to have a rectangular shape in which the dimension in the width direction thereof is larger than the dimension W in the width direction of the source electrode 8. On the other hand, another substantially half of the polysilicon layer 5 on the drain electrode 9 side is formed in such a way that one rectangular shape in which a dimension d1 in the width direction is smaller than the dimension W in the width direction of the drain electrode 9 and the other rectangular shape in which a dimension d2 in the width direction is smaller than the dimension W in the width direction of the drain electrode 9 are provided at an interval. In this case, the entire length of the boundary line in the width direction between the polysilicon layer 5 and the drain electrode 9 is (d1+d2), and a relationship of (d1+d2)<W is satisfied.

Also in the second example, similar to the first example, by setting the entire length (d1+d2) of the boundary line to be smaller than the dimension W in the width direction of the source electrode 8 or the drain electrode 9, in the channel region, a region adjacent to or a region in the vicinity of the source electrode 8 or the drain electrode 9 is formed into the amorphous silicon layer 4, such that it is possible to reduce the off-current while suppressing a decrease in the on-current.

Further, in the example of FIG. 6, the substantially half of the polysilicon layer 5 on the drain electrode 9 side is formed so as to have two rectangular shapes in which the dimension in the width direction (d1+d2) is smaller than the dimension W in the width direction of the drain electrode 9. However, it is not limited thereto, and the substantially half of the polysilicon layer 5 on the source electrode 8 side may be formed so as to have two rectangular shapes in which the dimensions in the width direction thereof are smaller than the dimension W in the width direction of the source electrode 8. Further, in FIG. 6, two rectangular regions having dimensions d1 and d2 in the width direction are disposed at an interval, but three or more rectangular regions may be disposed, and the shape thereof is not limited to the rectangular shape, and may be formed in a required shape such as an elliptical shape, a triangular shape, or a trapezoidal shape.

Figure 7A:
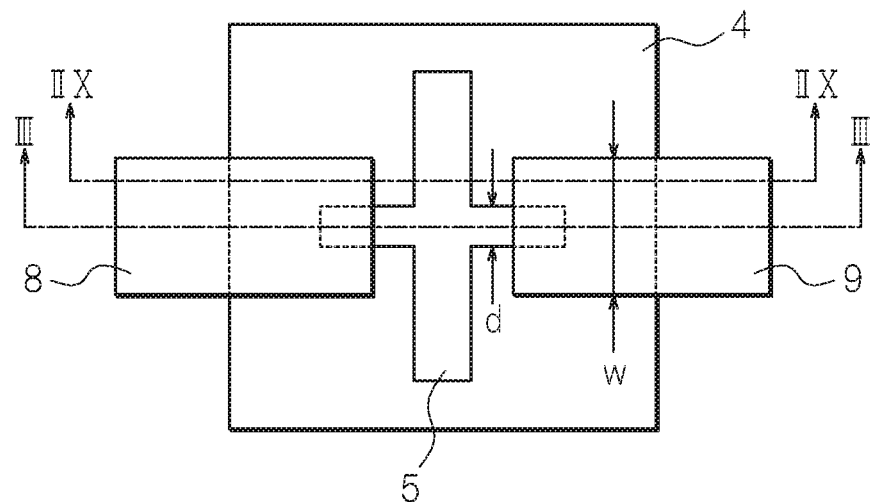
FIG. 7A is a schematic plan view of main components illustrating a third example of the structure of the thin film transistor according to the present embodiment.
Figure 7B:
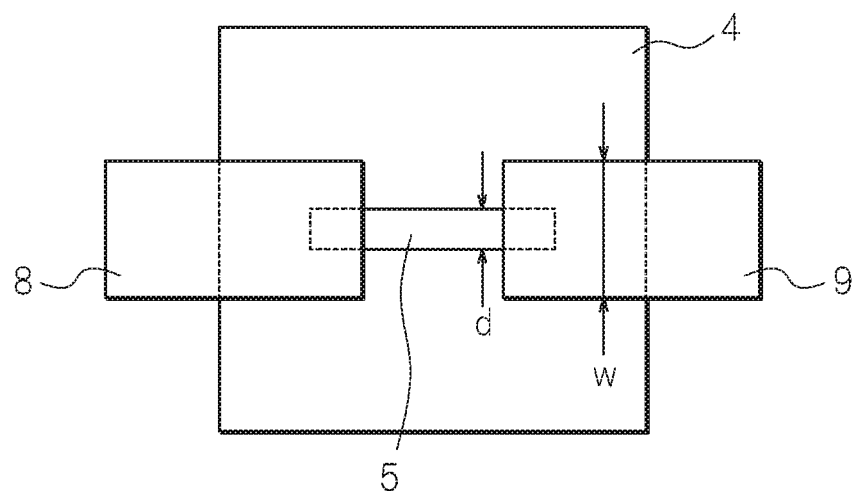
FIG. 7B is a schematic plan view of main components illustrating the third example of the structure of the thin film transistor according to the present embodiment.
Figure 8:
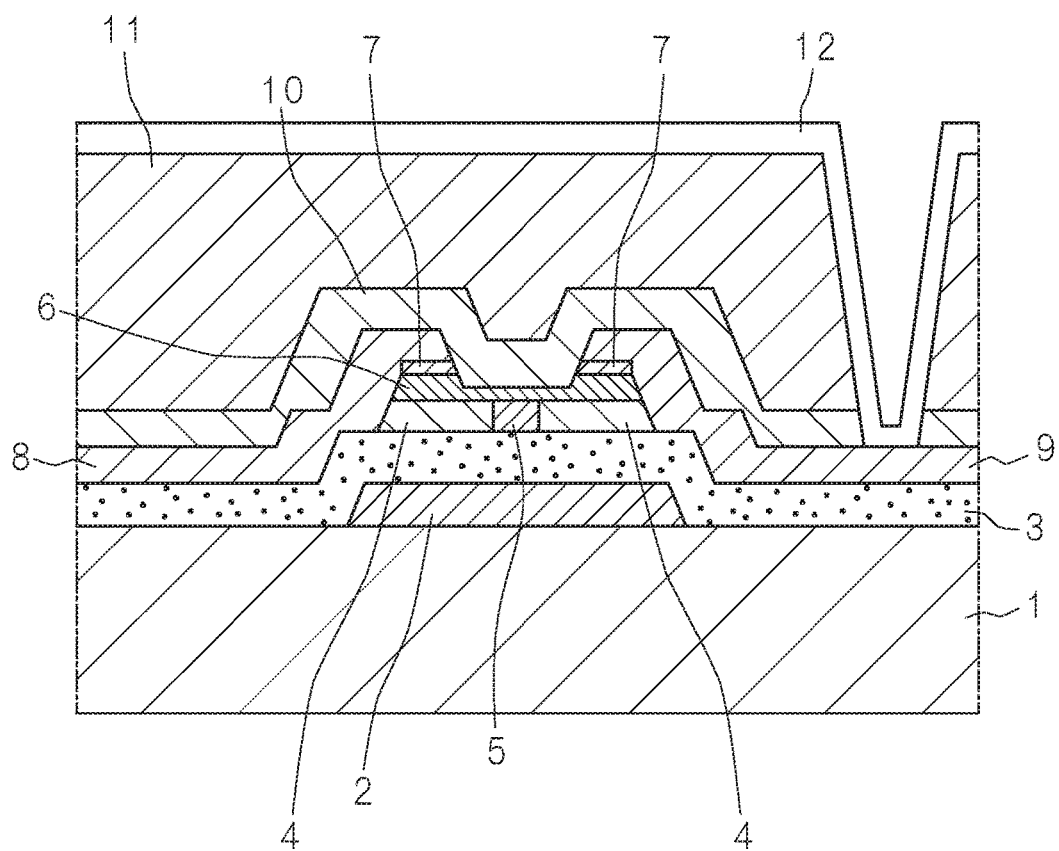
FIG. 8 is a schematic cross-sectional view of the main components as seen from line IIX-IIX of FIG. 7A.

FIGS. 7A and 7B are schematic plan views of main components illustrating a third example of the structure of the thin film transistor according to the present embodiment, and FIG. 8 is a schematic cross-sectional view of the main components as seen from line IIX-IIX of FIG. 7A. Further, in FIG. 7A, a schematic cross-sectional view of main components as seen from line II-II is similar to that of FIG. 2. As illustrated in FIG. 7A, in the third example, a central portion of the polysilicon layer 5 is formed so as to have a rectangular shape in which the dimension in the width direction thereof is larger than the dimension W in the width direction of the source electrode 8 or the drain electrode 9. On the other hand, the portion of the polysilicon layer 5 on the drain electrode 9 side and the portion of the polysilicon layer 5 on the source electrode 8 side are formed so as to respectively have a rectangular shape in which the dimension d in the width direction is smaller than the dimension W in the width direction of the source electrode 8 or the drain electrode 9. In addition, as illustrated in FIG. 7B, the dimension of the central portion in the width direction of the polysilicon layer 5 may be smaller than the dimension W in the width direction of the source electrode 8 or the drain electrode 9. In the example of FIG. 7B, the polysilicon layer 5 is formed in a rectangular shape in which a dimension d in the width direction is constant, but it is not limited thereto, and it may be configured in such a way that the dimension in the width direction of the central portion of the polysilicon layer 5 is smaller than the dimension W in the width direction of the source electrode 8 or the drain electrode 9, while setting the width dimension of the central portion of the polysilicon layer 5 to be larger than the dimension in the width direction of the portion of the polysilicon layer 5 on the source electrode 8 or the drain electrode 9 side.

By setting the entire length d of the boundary line of the polysilicon layer 5 with the source electrode 8 to be smaller than the dimension W in the width direction of the source electrode 8, and setting the entire length d of the boundary line of the polysilicon layer 5 with the drain electrode 9 to be smaller than the dimension W in the width direction of the drain electrode 9, a region adjacent to or a region in the vicinity of the source electrode 8 or the drain electrode 9 is formed into the amorphous silicon layer 4, such that it is possible to reduce the off-current.

Figure 9:
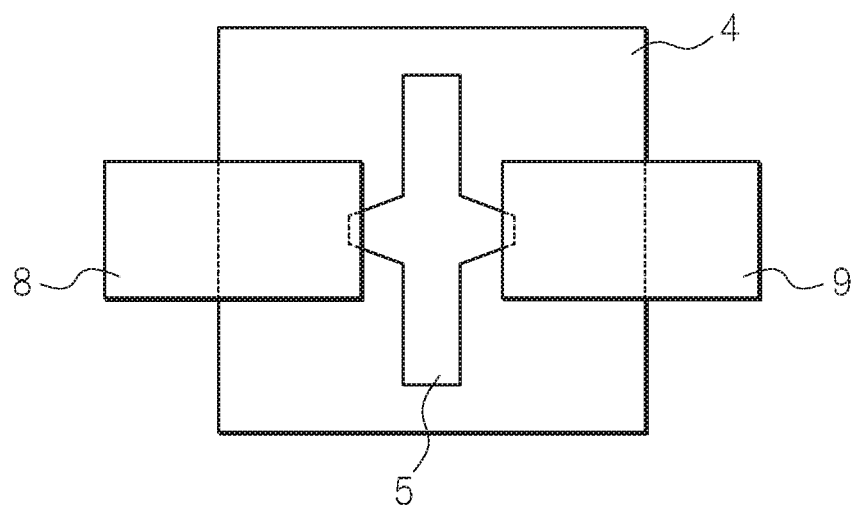
FIG. 9 is a schematic plan view of main components illustrating a fourth example of the structure of the thin film transistor according to the present embodiment.

FIG. 9 is a schematic plan view of main components illustrating a fourth example of the structure of the thin film transistor according to the present embodiment. The difference from the third example illustrated in FIG. 7 is that the shape in a plan view of the portion of the polysilicon layer 5 on the drain electrode 9 side and the shape in a plan view of the portion of the polysilicon layer 5 on the source electrode 8 side are formed in a trapezoidal shape, and the dimensions in the width direction thereof are configured so as to be decreased toward the direction of each electrode from the central portion of the polysilicon layer 5. Thereby, the lengths of the boundary lines between the polysilicon layer 5 and the source and drain electrodes 8 and 9 may be shortened to reduce the off-current, and an area in a plan view of the polysilicon layer 5 may be increased to further suppress a decrease in the on-current.

Figure 11:
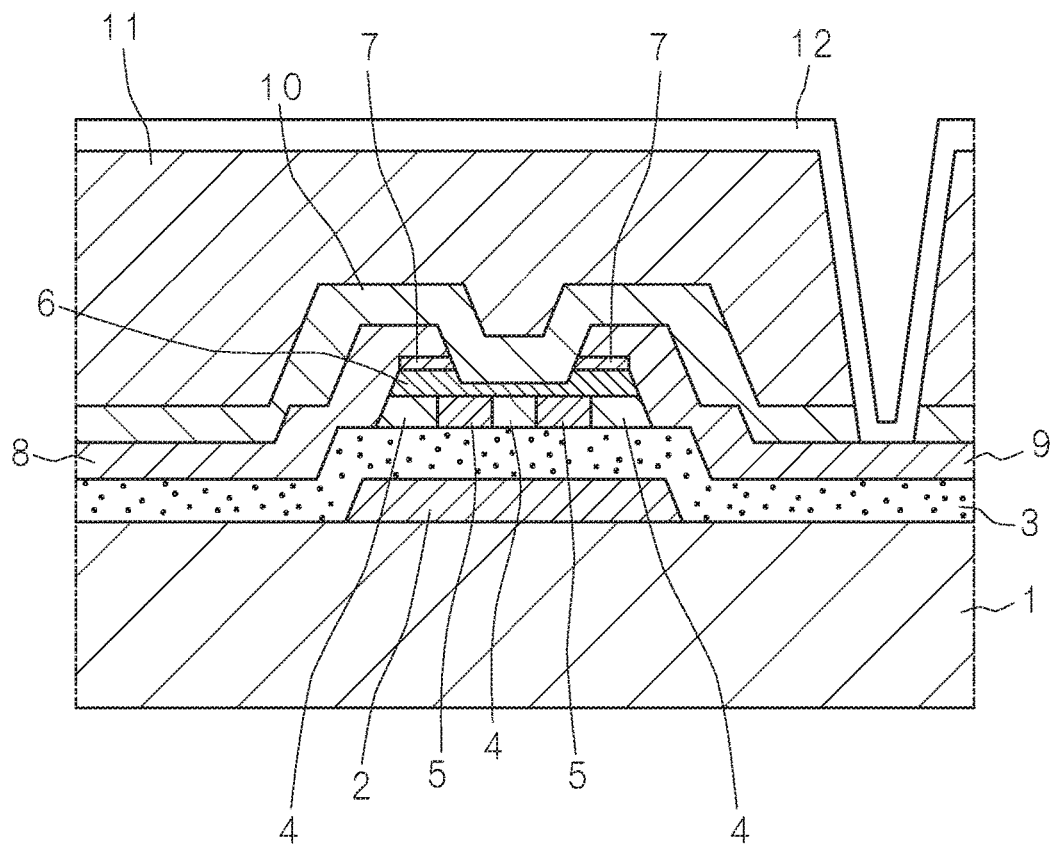
FIG. 11 is a schematic cross-sectional view of the main components as seen from line XI-XI of FIG. 10.

FIG. 10 is a schematic plan view of main components illustrating a fifth example of the structure of the thin film transistor according to the present embodiment, and FIG. 11 is a schematic cross-sectional view of the main components as seen from line XI-XI of FIG. 10. As illustrated in FIG. 10, in the fifth example, the central portion of the polysilicon layer 5 is formed so as to have a rectangular shape in which a dimension d in the width direction is smaller than the dimension W in the width direction of the source electrode 8 or the drain electrode 9. On the other hand, the portion of the polysilicon layer 5 on the drain electrode 9 side and the portion of the polysilicon layer 5 on the source electrode 8 side are formed so as to respectively have a rectangular shape in which the dimension in the width direction thereof is larger than the dimension W in the width direction of the source electrode 8 or the drain electrode 9.

As described above, by setting the minimum dimension d in the width direction of the polysilicon layer 5 in the channel region to be smaller than the dimension W in the width direction of the source electrode 8 or the drain electrode 9, as the channel region, the region of the amorphous silicon layer 4 having a high resistance is increased, such that the off-current may be more reduced than the case in which the dimension in the width direction of the polysilicon layer is set to be approximately equal to the dimension in the width direction of the source electrode or the drain electrode.

Figure 12:
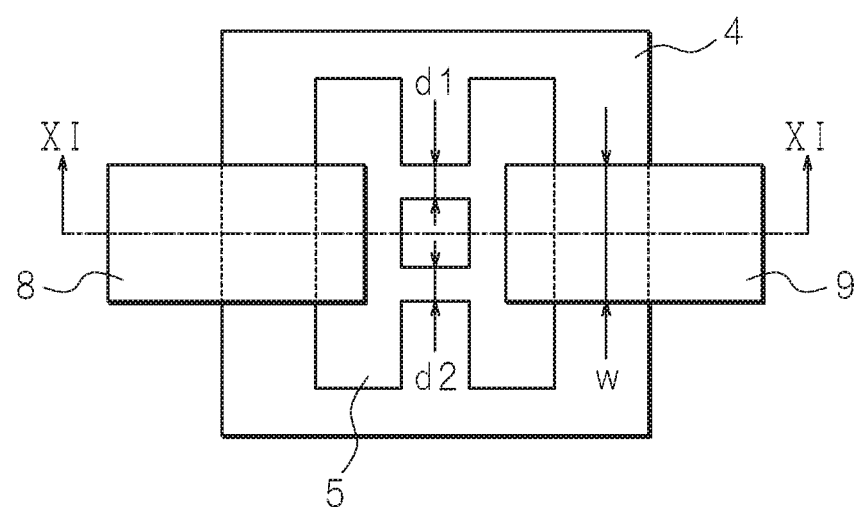
FIG. 12 is a schematic plan view of main components illustrating a sixth example of the structure of the thin film transistor according to the present embodiment.

FIG. 12 is a schematic plan view of main components illustrating a sixth example of the structure of the thin film transistor according to the present embodiment. In FIG. 12, a schematic cross-sectional view of main components as seen from line XI-XI is similar to that of FIG. 11. Unlike the fifth example, in the sixth example, the central portion of the polysilicon layer 5 is formed in such a way that one rectangular shape in which a dimension d1 in the width direction is smaller than the dimension W in the width direction of the source electrode 8 or the drain electrode 9 and the other rectangular shape in which a dimension d2 in the width direction is smaller than the dimension W in the width direction of the source electrode 8 or the drain electrode 9 are provided at an interval. In this case, the minimum dimension in the width direction of the polysilicon layer 5 is (d1+d2), and a relationship of (d1+d2)<W is satisfied.

Also in the case of the sixth example, similar to the case of the fifth example, by setting the minimum dimension d in the width direction of the polysilicon layer 5 in the channel region to be smaller than the dimension W in the width direction of the source electrode 8 or the drain electrode 9, as the channel region, the region of the amorphous silicon layer 4 having a high resistance is increased, such that the off-current may be more reduced than the case in which the dimension in the width direction of the polysilicon layer is set to be approximately equal to the dimension in the width direction of the source electrode or the drain electrode.

Figure 13:
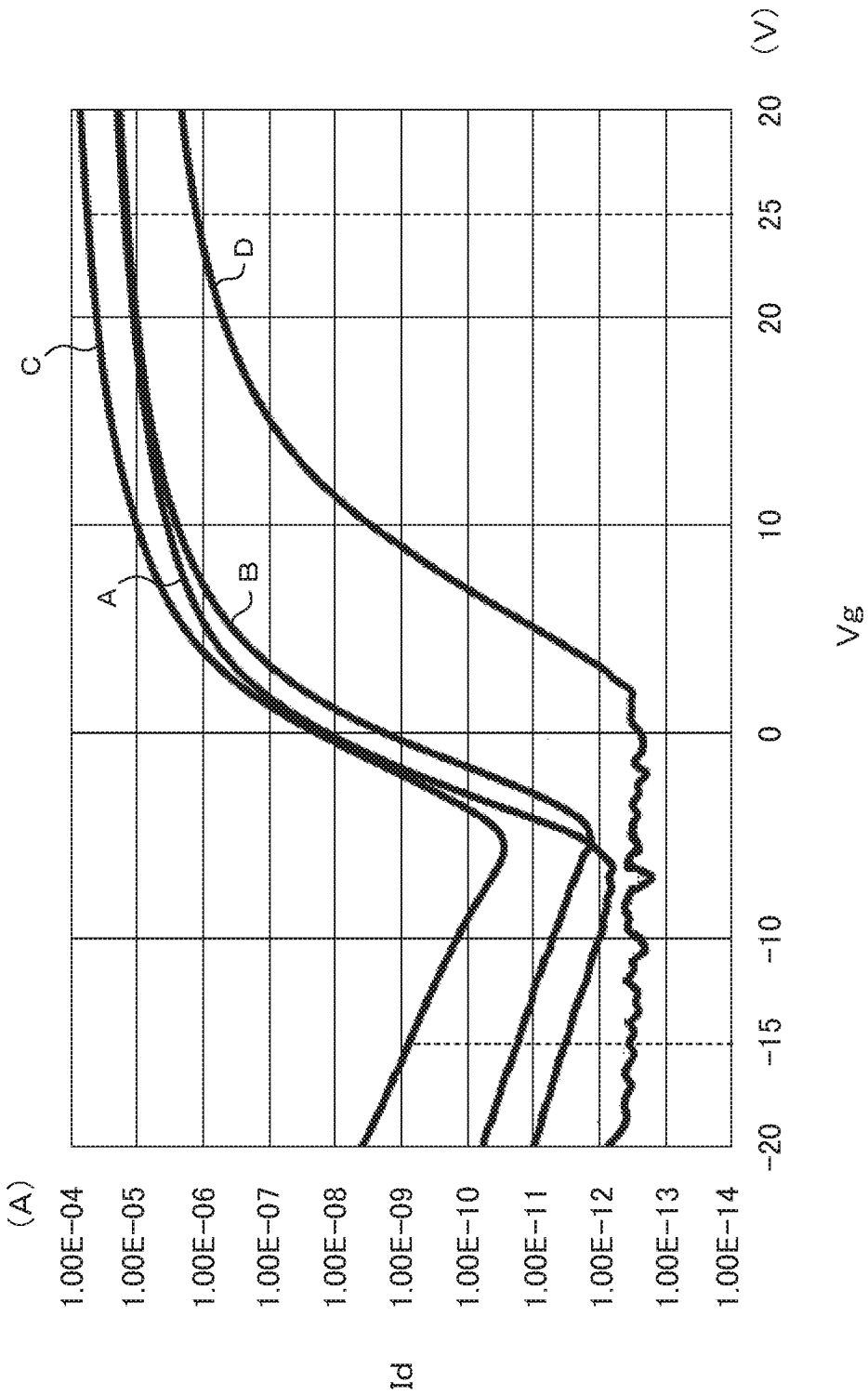
FIG. 13 is an explanatory view illustrating an example of Vg-Id characteristics of the thin film transistor according to the present embodiment.

FIG. 13 is an explanatory view illustrating an example of Vg-Id characteristics of the thin film transistor of the present embodiment. In FIG. 13, a horizontal axis represents Vg (a gate voltage) and a vertical axis represents Id (a drain current). In addition, a curve illustrated by symbol A in FIG. 13 represents characteristics of the first example illustrated in FIGS. 1 to 3, and a curve illustrated by symbol B represents characteristics of the second example illustrated in FIG. 6. Meanwhile, a curve illustrated by symbol C represents, in a conventional TFT as illustrated in FIGS. 15 and 16 to be described below, characteristics in a case in which, when the channel region is formed into the polysilicon layer, and the source electrode, the drain electrode and the polysilicon layer are projected onto the surface of the glass substrate, a part of each of the source electrode and the drain electrode and a part of the polysilicon layer overlap with each other.

In addition, a curve illustrated by symbol D represents the characteristics of the conventional TFT in which the amorphous silicon layer is formed by the channel region. For the sake of convenience, the on-current is set to be the drain current Id when the gate voltage Vg is 25 V, and the off-current is set to be the drain current Id when the gate voltage Vg is −15 V.

Figure 15:
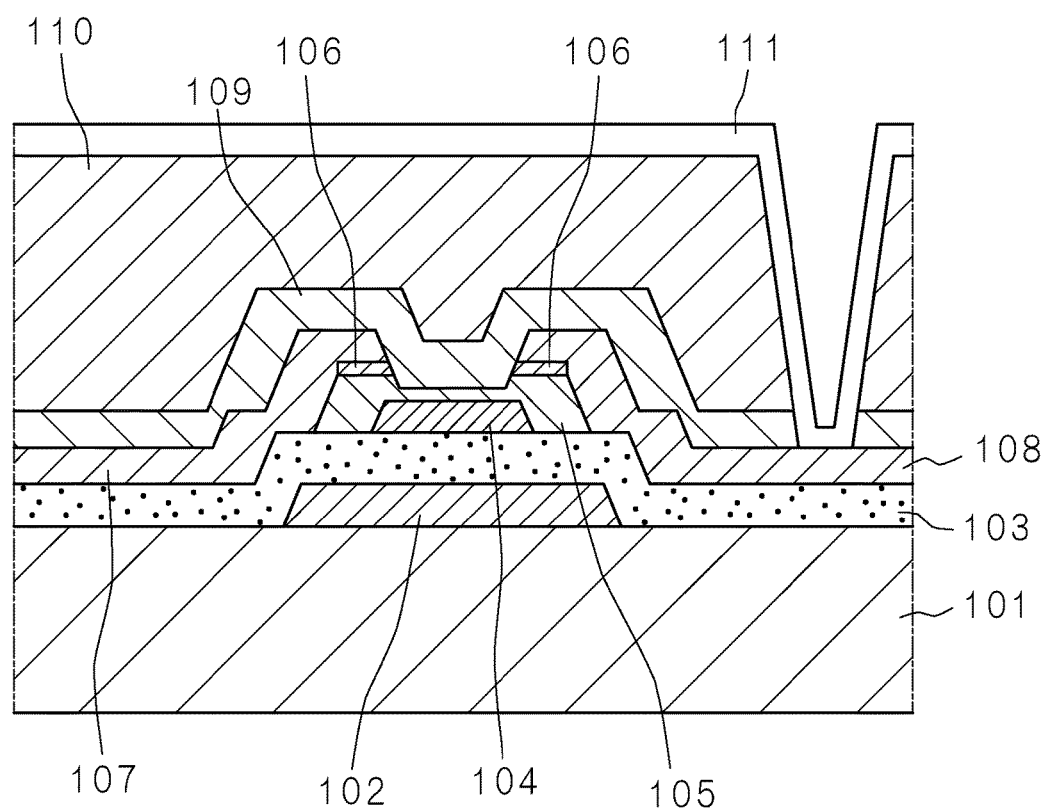
FIG. 15 is a schematic cross-sectional view of main components illustrating a structure of a conventional thin film transistor.
Figure 16:
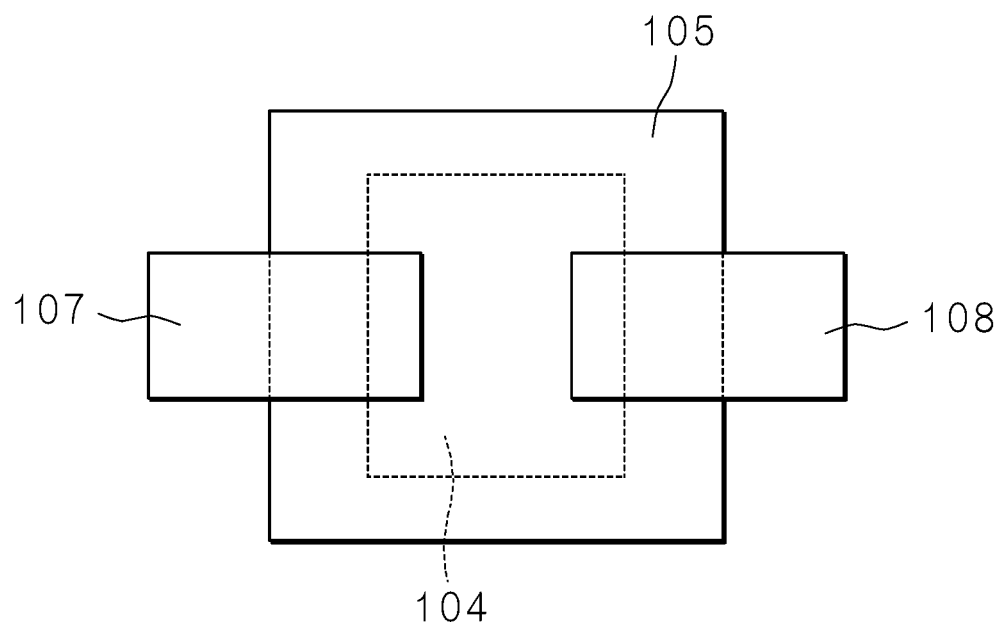
FIG. 16 is a schematic plan view of main components illustrating the structure of the conventional thin film transistor.

As illustrated by the symbol C in FIG. 13, in the case of the conventional TFT as illustrated in FIGS. 15 and 16, since the entire region of the channel in a plan view is formed by the polysilicon layer, the on-current is large, but there is a disadvantage that the off-current is increased. Further, in the case of the conventional TFT as illustrated by the symbol D, since the entire region of the channel in a plan view is formed by the amorphous silicon layer, the off-current may be reduced, but there is a disadvantage that the on-current may also be reduced.

On the other hand, in the case of the thin film transistor of the present embodiment illustrated by the symbols A and B, it is possible to reduce the off-current while suppressing a decrease in the on-current. Further, in the case of the first example illustrated by the symbol A, the off-current may be more reduced than the case of the second example illustrated by the symbol B.

Figure 14:
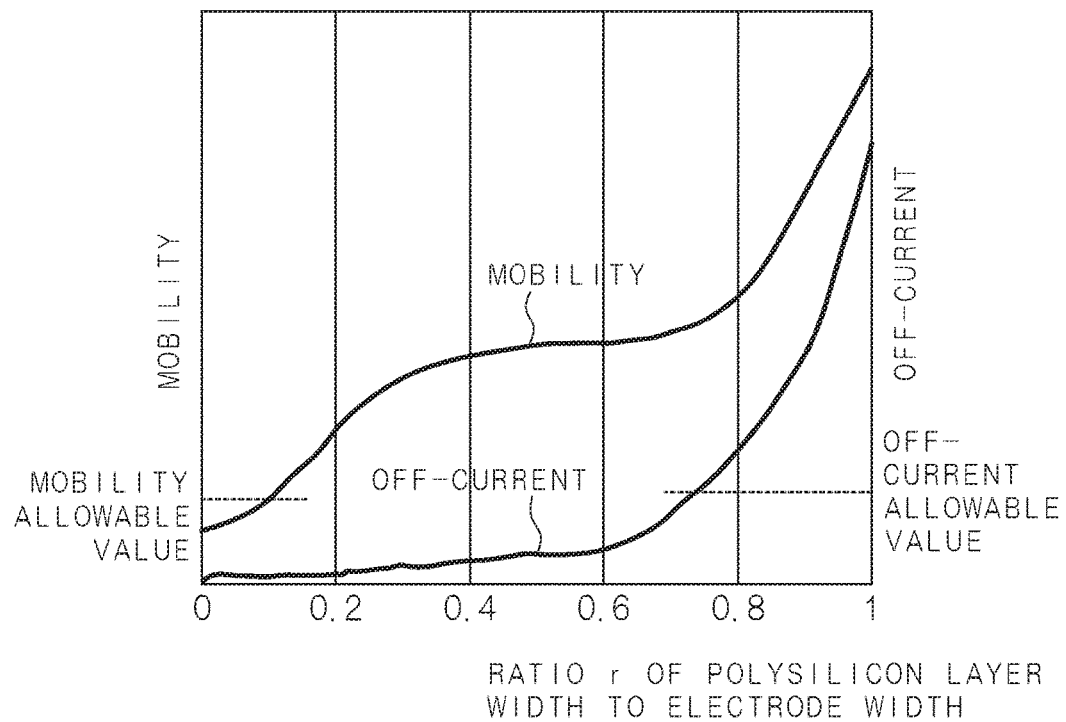
FIG. 14 is a schematic view illustrating an example of mobility and an off-current of the thin film transistor according to the present embodiment.

FIG. 14 is a schematic view illustrating an example of mobility and an off-current of the thin film transistor according to the present embodiment. In FIG. 14, a horizontal axis represents a ratio r of the dimension in the width direction of the polysilicon layer 5 to the dimension W in the width direction of the source electrode 8 or the drain electrode 9, and a vertical axis represents the mobility and the off-current. As illustrated in FIG. 14, the mobility of the thin film transistor has characteristics of increasing as the ratio r is increased. Further, the off-current of the thin film transistor has characteristics of also increasing as the ratio r is increased. Furthermore, straight lines representing the mobility and the off-current in FIG. 14 are schematically shown for the sake of simplicity, and may be different from the actual characteristics.

In the thin film transistor of the present embodiment, the ratio r of the entire length of the boundary line between the polysilicon layer 5 and the source electrode 8 to the dimension in the width direction of the source electrode 8, or the ratio r of the entire length of the boundary line between the polysilicon layer 5 and the drain electrode 9 to the dimension in the width direction of the drain electrode 9 is larger than 0.1 and smaller than 0.7. If the ratio r is set to be 0.1 or less, the region of the polysilicon layer 5 in the channel region is decreased and the region of the amorphous silicon layer 4 is increased, such that the mobility of electrons in the channel region is decreased. In the example of FIG. 14, for example, the mobility of electrons becomes smaller than an allowable value.

In addition, if the ratio r is set to be 0.7 or more, the region of the polysilicon layer 5 in the channel region is increased and the region of the amorphous silicon layer 4 is decreased, such that the off-current is increased. In the example of FIG. 14, for example, the off-current becomes larger than the allowable value.

By setting the ratio r to be larger than 0.1 and smaller than 0.7, the off-current may be reduced while suppressing a decrease in the mobility of electrons of the channel region (that is, without decreasing the on-current).

Next, the conventional TFT as a comparative example will be described. FIG. 15 is a schematic cross-sectional view of main components illustrating a structure of the conventional thin film transistor, and FIG. 16 is a schematic plan view of main components illustrating the structure of the conventional thin film transistor. The conventional thin film transistor includes a gate electrode 102 formed on the surface of a glass substrate 101, and a gate insulation film 103 formed by covering the gate electrode 102. A polysilicon layer (poly-Si film) 104 is formed on the surface of the gate insulation film 103 and the upper side of the gate electrode 102.

An amorphous silicon layer (a-Si film) 105 is formed on the polysilicon layer 104 so as to cover the same. An n+ silicon layer (n+Si film) 106 is formed at a required position on the surface of the amorphous silicon layer 105. A source electrode 107 and a drain electrode 108 respectively having a required pattern are formed on the surface of the n+ silicon layer 106, the side face of the amorphous silicon layer 105, and the surface of the gate insulation film 103. In addition, as illustrated in FIG. 16, the entire region of the channel is formed by the polysilicon layer 104. Therefore, that the mobility of electrons is high, but there is a problem that the off current is increased.

Figure 17:
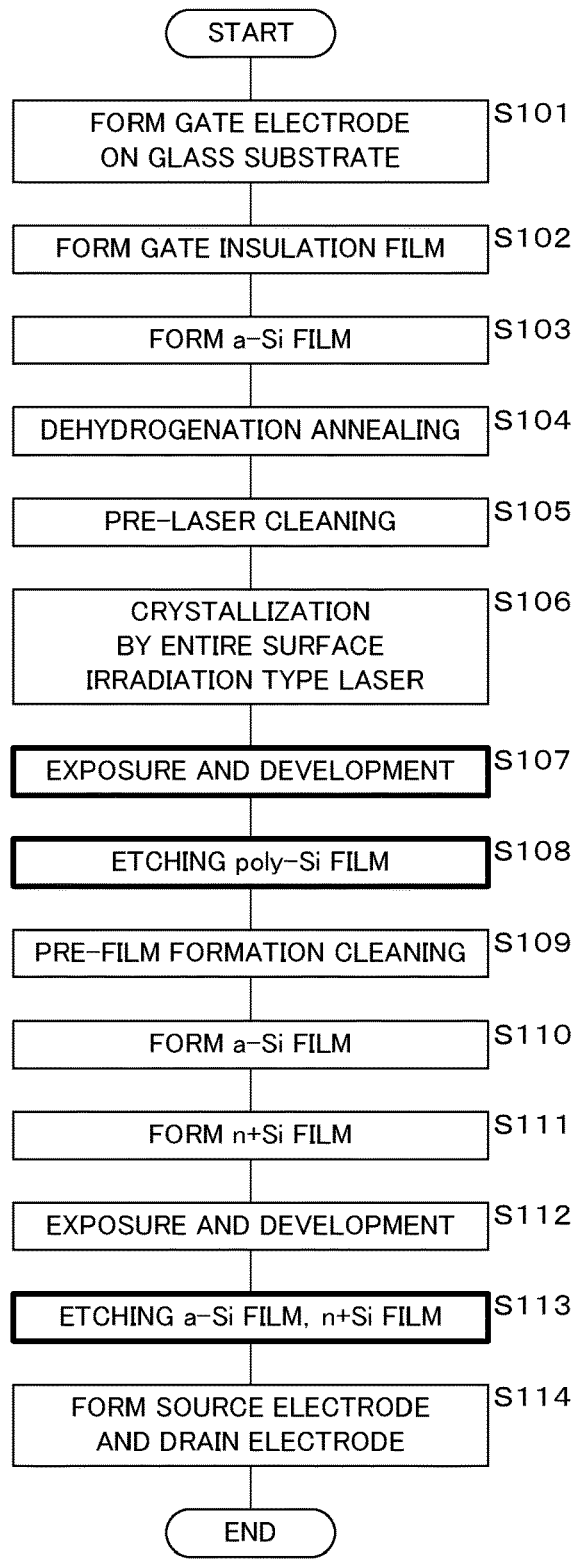
FIG. 17 is a flow chart of manufacturing processes illustrating a method for manufacturing the conventional thin film transistor.

FIG. 17 is a flow chart of manufacturing processes illustrating a method for manufacturing the conventional thin film transistor. As illustrated in FIG. 17, the gate electrode 102 is formed on the glass substrate 101 (S101), and the gate insulation film 103 is formed on the surface of the glass substrate 101 by covering the gate electrode 102 (S102).

An a-Si film is formed on the surface of the glass substrate 101 on which the gate insulation film 103 is formed (S103). In order to laser anneal the a-Si film, dehydrogenation annealing treatment is performed (S104), and cleaning prior to laser annealing is performed (S105).

Next, crystallization of the a-Si film by an entire surface irradiation type laser is performed (S106).

Figure 18:
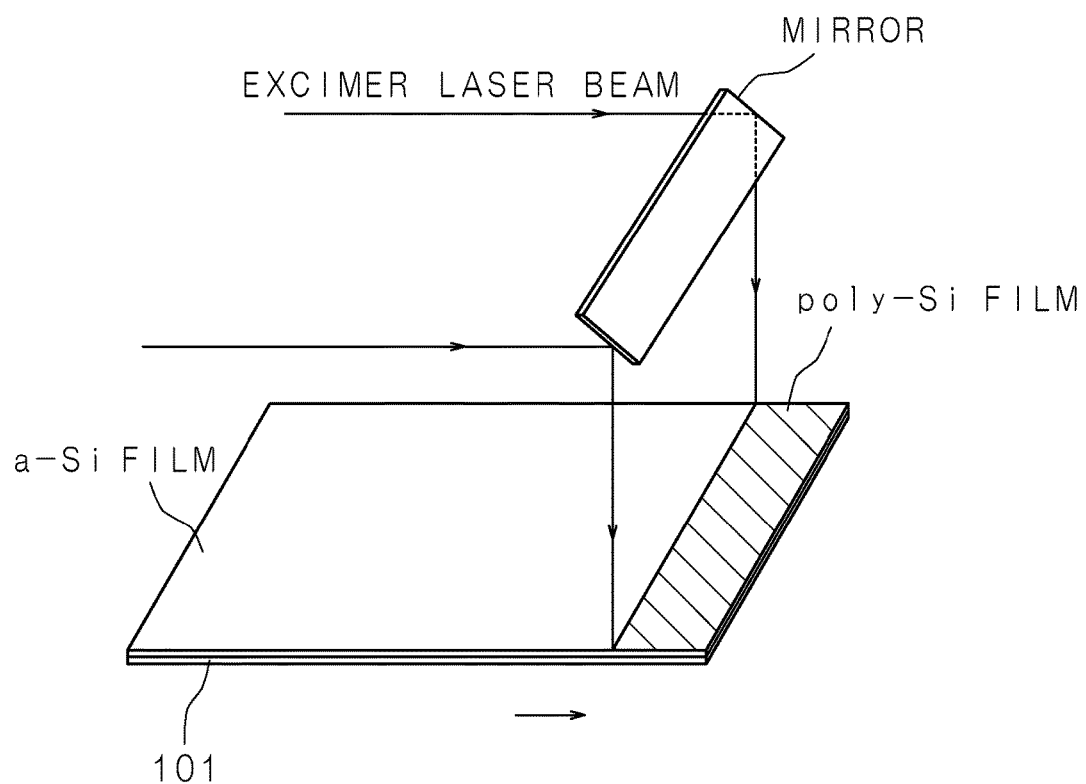
FIG. 18 is a schematic view illustrating an example of a configuration of conventional entire surface irradiation type laser.

FIG. 18 is a schematic view illustrating an example of a configuration of the conventional entire surface irradiation type laser. As illustrated in FIG. 18, the glass substrate 101 on which the a-Si film is formed is placed on a mount table (not illustrated), and is moved parallel to a direction shown by an arrow in FIG. 15 at a required speed. A mirror having a length substantially the same as the dimension in a width direction of the glass substrate 101 (direction intersecting the direction of parallel movement) is disposed above the glass substrate 101. A laser beam from a laser light source (not illustrated) is made incident on the mirror, thereby the laser beam is irradiated to the entire surface of the glass substrate 101. As a result, all of the a-Si film is changed to the polysilicon layer (p-Si film).

Next, exposure and development process are performed on the polysilicon layer (p-Si film) formed on the whole of the surface of the glass substrate 101 (S107), and further etching process is performed thereon (S108). Thereby, the polysilicon layer 104 as the channel region is formed.

Then, cleaning prior to film formation is performed (S109), and the a-Si film 105 is formed by covering the polysilicon layer 104 (5110). The n+Si film (n+ silicon layer) 106 is formed on the surface of the a-Si film 105 (5111).

Next, exposure and development process are performed (S112), and in order to make the semiconductor layer have a required structure, the a-Si film 105 and the n+Si film 106 are etched (S113). Then, the source electrode 107 and the drain electrode 108 are formed on the n+Si film 106 after the etching (S114).

As illustrated in FIG. 18, as compared to the conventional case in which, after the amorphous silicon layer formed on the whole of the surface of the substrate is changed to the polysilicon layer by irradiating the entire surface of the substrate with an energy beam (for example, laser), each process of exposure, development and etching process is performed on the polysilicon layer to form the channel region, according to the manufacturing method of the present embodiment, the entire surface of the substrate is not irradiated with the energy beam (for example, laser), but, in the first amorphous silicon layer, only the required region of the channel region is partially irradiated with the energy beam, such that it is possible to form the polysilicon layer within the channel region only by the annealing process. Therefore, each process of exposure, development and etching process (steps S107 and S108 illustrated in FIG. 18) for forming the channel region is not required, and thereby the manufacturing process may be shortened.

The thin film transistor of the present embodiment may be used for a display panel. That is, the thin film transistor (TFT substrate) of the present embodiment and a color filter substrate having red (R), green (G) and blue (B) colors are bonded to each other at a required gap, and liquid crystal is injected and sealed between the TFT substrate and the color filter substrate, such that a TFT type liquid crystal display panel (liquid crystal display) may be manufactured. Thereby, it is possible to provide a display panel having a reduced off-current.

It is to be noted that, as used herein and in the appended claims, the singular forms "a", "an", and "the" include plural referents unless the context clearly dictates otherwise.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A thin film transistor, comprising:
a gate electrode formed on a surface of a substrate;
a polysilicon layer formed on an upper side of the gate electrode;
an amorphous silicon layer formed so as to cover the polysilicon layer;
an n+silicon layer formed on an upper side of the amorphous silicon layer; and
a source electrode and a drain electrode which are formed on the n+silicon layer,
wherein, in a projected state in which the polysilicon layer, the source electrode and the drain electrode are projected onto the surface of the substrate, a part of the polysilicon layer and a part of each of the source electrode and the drain electrode are adapted so as to be overlapped with each other,
in the projected state, a minimum dimension, in a width direction orthogonal to a length direction between the source electrode and the drain electrode and parallel to the surface of the substrate, of the polysilicon layer located between the source electrode and the drain electrode is smaller than dimensions in the width direction of the source electrode and the drain electrode,
the polysilicon layer includes a plurality of regions having different dimensions in the width direction, and
the plurality of regions includes a first region and a second region,
wherein
the dimensions in the width direction of the first region is larger than dimensions in the width direction of the source electrode and the drain electrode, and
the dimensions in the width direction of the second region is smaller than dimensions in the width direction of the source electrode and the drain electrode.

2. The thin film transistor according to claim 1, wherein, in the projected state, the polysilicon layer and at least one of the source electrode and the drain electrode are adapted so as to be overlapped with each other through at least one of a boundary line in the width direction between the polysilicon layer and the source electrode and a boundary line in the width direction between the polysilicon layer and the drain electrode, and
an entire length of the boundary line between the polysilicon layer and the source electrode or an entire length of the boundary line between the polysilicon layer and the drain electrode is smaller than the dimension in the width direction of the source electrode or the drain electrode.

3. The thin film transistor according to claim 2, wherein a ratio of the entire length of the boundary line between the polysilicon layer and the source electrode to the dimension in the width direction of the source electrode, or a ratio of the entire length of the boundary line between the polysilicon layer and the drain electrode to the dimension in the width direction of the drain electrode is larger than 0.1 and smaller than 0.7.

4. The thin film transistor according to claim 1, wherein the amorphous silicon layer includes:
   a first amorphous silicon layer which is formed around the polysilicon layer and has a thickness approximately equal to the thickness of the polysilicon layer; and
   a second amorphous silicon layer formed on the surfaces of the polysilicon layer and the first amorphous silicon layer.

5. A display panel comprising thin film transistor according to claim 1.

6. The thin film transistor according to claim 2, wherein the entire length of the boundary line between the polysilicon layer and the source electrode is different from the entire length of the boundary line between the polysilicon layer and the drain electrode.

* * * * *